(12) United States Patent
Eslampour

(10) Patent No.: US 6,527,163 B1
(45) Date of Patent: Mar. 4, 2003

(54) METHODS OF MAKING BONDABLE CONTACTS AND A TOOL FOR MAKING SUCH CONTACTS

(75) Inventor: Hamid Eslampour, San Jose, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/865,686

(22) Filed: Nov. 21, 2000

Related U.S. Application Data

(60) Provisional application No. 60/177,298, filed on Jan. 21, 2000.

(51) Int. Cl.$^7$ ............................. B23K 31/02; B23K 31/00
(52) U.S. Cl. ............... 228/180.1; 228/155; 228/180.22
(58) Field of Search ............... 228/180.22, 180.5, 228/110.1, 141.1, 155, 164, 165, 180.1

(56) References Cited

U.S. PATENT DOCUMENTS

| | | | | |
|---|---|---|---|---|
| 5,016,803 A | * | 5/1991 | Ohashi et al. ............... 228/104 |
| 5,018,658 A | * | 5/1991 | Farassat ....................... 228/15.1 |
| 5,390,844 A | | 2/1995 | DiStefano et al. ........ 228/180.21 |
| 5,489,749 A | | 2/1996 | DiStefano et al. ............. 174/261 |
| 5,516,029 A | * | 5/1996 | Grasso et al. ............... 228/180.5 |
| 5,559,054 A | * | 9/1996 | Adamjee ...................... 228/179.1 |
| 5,597,469 A | * | 1/1997 | Carey et al. ................... 205/118 |
| 6,000,603 A | * | 12/1999 | Koskenmaki et al. ........ 228/170 |
| 6,234,373 B1 | * | 5/2001 | Wark .......................... 228/141.1 |
| 6,260,753 B1 | * | 7/2001 | Renard et al. ................ 228/155 |
| 6,271,601 B1 | * | 8/2001 | Yamamoto et al. ........... 228/104 |
| 6,296,171 B1 | * | 10/2001 | Hembree et al. .............. 156/73.1 |
| 6,311,888 B1 | * | 11/2001 | Funada et al. ............... 228/106 |

* cited by examiner

*Primary Examiner*—Tom Dunn
*Assistant Examiner*—Zidia Pittman
(74) *Attorney, Agent, or Firm*—Lerner, David, Littenberg, Krumholz & Mentlik, LLP

(57) ABSTRACT

A method of making bondable contacts on a microelectronic element includes providing a microelectronic element having one or more die pads on a first face thereof and depositing conductive bonding material, such as gold, atop each die pad. The conductive bonding material is then shaped using a contact forming tool to form bondable contacts. The bondable contact has a substantially flat region and a second region projecting above the substantially flat region. The second region includes an apex adapted to abut against an opposing electrically conductive element. The bondable contacts may be formed one at a time or a plurality of the bondable contacts may be formed simultaneously. In one preferred embodiment, the projecting region of the contact defines a wedge-shaped projection that is bounded by the substantially flat region thereof. Each wedge-shaped projection may include an apex and side-walls extending between the apex and the substantially flat region of the contact.

27 Claims, 11 Drawing Sheets

$A = \pi r^2$
$\sigma = F/A$ $A1 = L \times W$
$\sigma1 = F/A1$

WHERE; $A1 << A2$ $A2 = \pi r^{**}2$
$\sigma2 = F/A2$

WHERE; $A1 << A2$

METHODS OF MAKING BONDABLE CONTACTS AND A TOOL FOR MAKING SUCH CONTACTS

CROSS REFERENCE TO RELATED APPLICATIONS

The present application claims benefit of U.S. Provisional Application Ser. No. 60/177,298 filed Jan. 21, 2000, the disclosure of which is hereby incorporated by reference herein.

FIELD OF THE INVENTION

The present invention relates to methods of making contacts for microelectronic elements, such as semiconductor wafers and chips and circuit panels, and more specifically relates to methods of making contacts on microelectronic elements that are bondable with leads using relatively low bonding forces.

BACKGROUND OF THE INVENTION

Semiconductor chips are typically connected to external circuitry through electrical contacts provided on a face surface of the chip. The contacts on the chip may be disposed in various patterns such as a grid substantially covering the front surface of the chip, commonly referred to as an "area array," or in elongated rows extending parallel to and adjacent each edge of the chip face surface. Each contact on the chip must be connected to external circuitry, such as the circuitry of a supporting substrate or circuit panel. Various processes for making these interconnections use prefabricated arrays of leads or discrete wires. For example, in a ball or stitch bonding process, a wire-bonding tool is used to electrically connect chip contacts with contacts on a circuit panel. After a non-contact bearing surface of the chip is mounted on the circuit panel, a fine wire is fed through the wire-bonding tool. The bonding tool is then brought into engagement with the contact on the chip so as to bond the wire to the contact. The tool is then moved to a contact on the circuit panel, so that a small piece of wire is dispensed and formed into a lead. The lead connects the chip contact with the circuit panel contact. This process is repeated for every contact on the chip.

In what is commonly referred to as the tape automated bonding or "TAB" process, a dielectric supporting tape, such as a thin foil of polyamide is provided with an aperture slightly larger than the chip. An array of metallic leads is provided on one surface of the dielectric film. These leads extend inwardly from around the aperture towards the edges of the aperture. Each lead has an innermost end projecting inwardly, beyond the edge of the aperture. The innermost ends of the leads are arranged side by side at spacing corresponding to the spacing of the contacts on the chip. The dielectric film is juxtaposed with the chip so that the aperture is aligned with the chip and so that the innermost ends of the leads will extend over the contact bearing surface on the chip. The innermost ends of the leads are then bonded to the contacts of the chip, such as by using ultrasonic or thermocompression bonding techniques. The outer ends of the leads are connected to external circuitry.

In a "beam lead" process, the chip is provided with individual leads extending from contacts on the front surface of the chip outwardly beyond the edges of the chip. The chip is positioned on a substrate with the outermost ends of the individual leads protruding over contacts on the substrate. The leads are then engaged with the contacts and bonded thereto so as to connect the contacts on the chip with contacts on the substrate.

Typically, the leads are bonded to the chip contacts by a bonding tool using heat, force, ultrasonic energy, or a combination of two or more thereof, for a given time period. If an incorrect ratio of force, heat and/or ultrasonic energy is used, the bond between the leads and the contacts may be too weak to undergo the thermal cycling stress during operation of the chip (heating and cooling cycles during operation). For example, if too much force is used the bonding tool may create areas of the lead which are prone to early fatigue during thermal cycling because of excessive non-uniform deformations in the bonding region typically causing early breaks in the lead at the point the lead bends up from the chip surface (commonly referred to as a "heel break"). Further, obtaining good intermetallic bonds which are substantially uniform across the surface of the bond between the lead and contact surfaces is critical to a well performing lead bond. Uneven intermetallic growth can cause embrittlement of the lead in and around the bond area thereby causing early fatigue of the lead during thermal cycling. Intermetallic diffusion will typically only take place at the bonded sites of the lead and the contact thereby causing sites of gross intermetallic formation which may cause an unreliable bond. Further, impurities in the bond lead (such as co-deposited plated lead impurities or other surface impurities) tend to migrate to the unevenly bonded intermetallic sites during the high temperatures used in chip packaging thus weakening the bond. Both of these problems may worsen the creation of a phenomenon called Kirkendahl Voiding (voids created at the boundary of two metals having different interdiffusion coefficients). This voiding along the boundary of the two metals (lead/contact) generally causes intermetallic degradation, brittleness of the lead itself and weakening of the bond making the lead/bond susceptible to failure during thermal cycling.

As chip packages are made smaller and smaller, the lead dimensions will also be reduced compounding this problem by making it more difficult to reliably bond the leads to their respective chip contacts using conventional bonding techniques.

Commonly assigned U.S. Pat. No. 5,390,844, the disclosure of which is hereby incorporated by reference herein, discloses a bonding tool for bonding leads to contacts on semiconductor chips. In preferred embodiments, the bonding tool has a lower end defining guide surfaces for engaging elongated leads disposed beneath the tool upon downward movement of the tool from above the leads. The guide surfaces are adapted to engage a lead extending in either of two mutually orthogonal directions and to center the engaged lead beneath the bonding region of the lower end so that the lead can be engaged and bonded by the tool. With either orientation of the lead, the tool will capture and align the lead, and bring the lead into position for bonding. Commonly assigned U.S. Pat. No. 5,489,749, the disclosure of which is incorporated by reference herein, describes another bonding tool arranged to capture and align a lead. In preferred embodiments of the '749 patent, the bonding tool is a blade-like device with an elongated bottom edge and with a groove extending lengthwise along the bottom edge for engaging the leads to be bonded.

FIGS. 1A–1E show prior art methods commonly use to bond leads to contacts on a microelectronic element. Referring to FIG. 1A, a microelectronic element 10 has a contact bearing face 12 including die pad 14 and a bump of a conductive bonding material 16, such as gold. The conductive bump 16 shown in FIG. 1A is formed using a wire bonding tool. However, other methods may be used for depositing conductive bumps 16 including using a stenciling process. Referring to FIG. 1B, the gold bump 16 is then reflowed, such as by applying heat energy to the gold bump, to allow surface tension to reshape the conductive bump 16 into one having a rounded, curved or spherical top surface.

Referring to FIG. 1C, the microelectronic element is then juxtaposed with a second element (not shown) having one or more conductive leads 18, such as gold leads. The tip ends 20 of the conductive leads are aligned with the bump 16 so that the lead 18 may be bonded to the bump 16, thereby creating an electrical interconnection between lead 18 and die pad 14.

Referring to FIGS. 1D, 2A and 2B, a bonding tool 22 is then utilized for bonding the lead 18 to the bump 16. The bonding tool 22 includes a tip end 24 having a substantially flat surface 26.

Referring to FIG. 1E, a downward force F is applied through tip end 24 of bond tool 22 and onto lead 18 for forming a bond between lead 18 and conductive bump 16. The strength of the bond is dependent upon three process factors: temperature, time and force used for forming the bond. The application of force using bond tool 22 exerts a stress in the mating surfaces of the lead 18 and bump 16 which provides the interfacial contact needed for diffusion bonding.

Despite the substantial time and effort devoted heretofore to the problems associated with providing bonding tools, there are still unmet needs for improvements in such semiconductor chip package structures and methods.

SUMMARY OF THE INVENTION

The present invention provides methods of making bondable contacts on a microelectronic element. In one preferred embodiment, the method includes providing a microelectronic element having one or more die pads on a first face thereof and depositing conductive bonding material, such as gold or a conductive paste, atop each die pad. A contact forming tool may then be utilized to shape the conductive bonding material to form bondable contacts. Each bondable contact preferably has a substantially flat region and a second region projecting above the substantially flat region. The projecting region of the contact may include a wedge-shaped projection that extends above and is bounded by the substantially flat region of the contact. The wedge-shaped projection preferably includes an apex above the substantially flat region and side walls extending between the apex and the substantially flat region of the contact.

The bondable contacts may be shaped or formed using a contact forming tool having a tip end with a substantially flat surface and a depression formed in the substantially flat surface. The depression may be a V-shaped groove extending across the tip end of the tool and having sidewalls that form an acute angle relative to one another. The groove may also have a substantially flat portion near the peak on the V-shape. During a contact shaping step, the tip end of the tool is abutted against the conductive bonding material to form the bondable contacts. The preferred shape of the groove formed in the tip end of the bump forming tool is V-shaped, however, other preferred shapes for the groove includes hemispherical, conical, truncated conical, and pyramidal.

In another embodiment of the present invention, a method of making a microelectronic assembly includes providing a first microelectronic element having a front face and a plurality of bondable contacts on the front face, wherein each bondable contact has a substantially flat region and a second region projecting above the substantially flat region. A second microelectronic element having one or more leads with bond regions is then juxtaposed with the microelectronic element so that the bond regions of the leads overlie the bondable contacts. The bond regions of the leads are then abutted against the projecting regions of the contacts and the bond regions of the leads are bonded to the contacts. During bonding, the projecting regions of the contacts deform the bond regions of the leads. The first and second microelectronic elements can be a semiconductor chip, semiconductor wafer, connection component, or a substrate. In certain preferred embodiments, the first microelectronic element is a semiconductor chip and the second microelectronic element is a connection component.

BRIEF DESCRIPTION OF THE DRAWINGS

FIG. 8F' shows a magnified view of FIG. 8F showing deformation of a lead after bonding.

DETAILED DESCRIPTION OF THE PREFERRED EMBODIMENTS

Figure 5A:
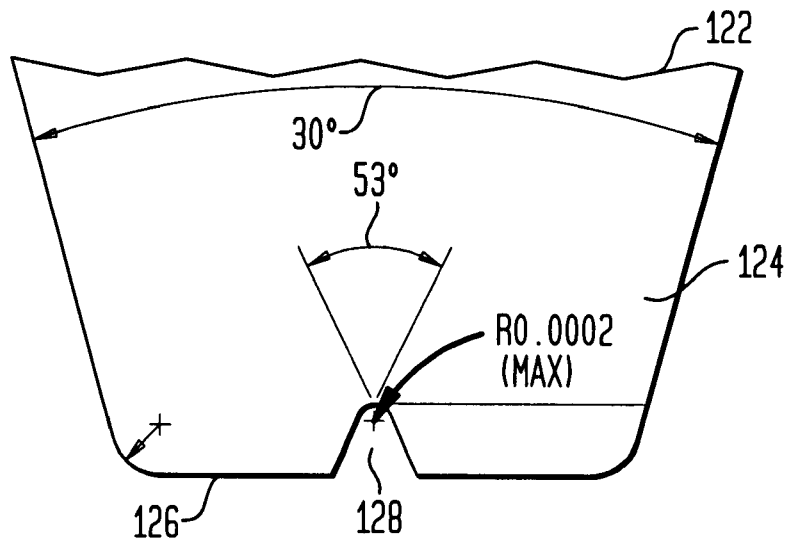
FIG. 5A shows a fragmentary side view of a contact forming tool having a tip end, in accordance with preferred embodiments of the present invention.
Figure 5B:
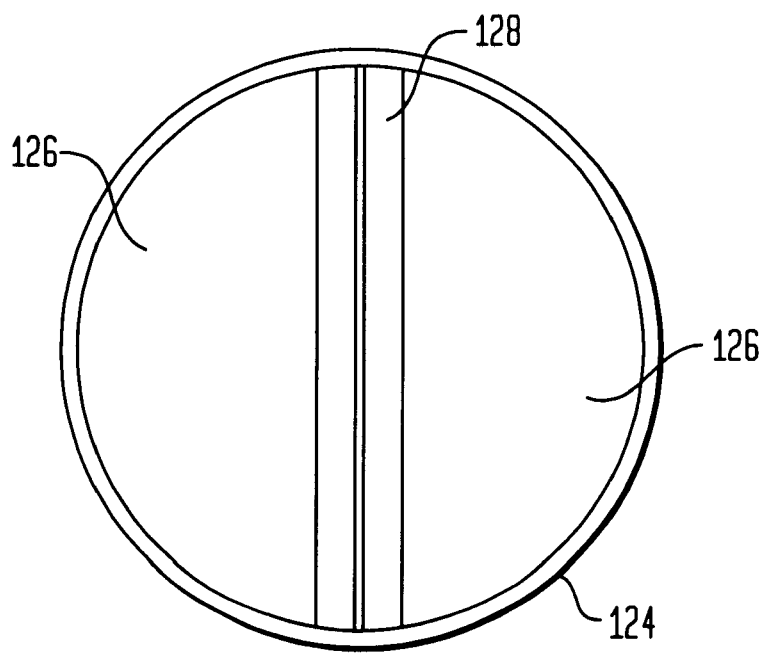
FIG. 5B shows a bottom view of the tip end of the contact forming tool shown in FIG. 5A.
Figure 9:
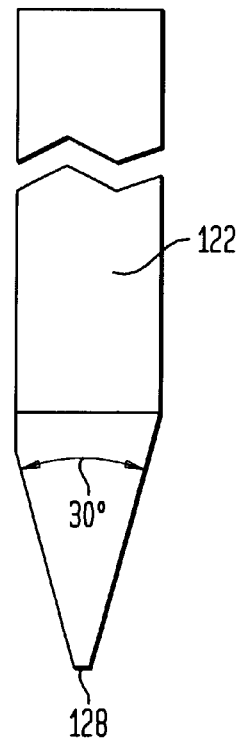
FIG. 9 shows a side view of the contact forming tool shown in FIG. 5A.

The present invention is directed to producing conductive contact bumps on die pads having substantially flat top surfaces and sharp, wedge shaped projections extending above the substantially flat surfaces. FIGS. 5A, 5B and 9 show a bump forming tool that maybe used to produce the wedge shaped projections shown in FIG. 6A. The bump forming tool includes a tip end 124 having a substantially flat bottom surface 126 with a V-shaped depression or groove 128 formed in the substantially flat surface 126. FIG. 5B shows a bottom view of the tip end 124 shown in FIG. 5A. The groove 128 extends across the diameter of the tip end 124 and is surrounded on both sides by the substantially flat surface 126. In one preferred embodiment, the groove 128 is a V-shaped groove having side walls that are angled relative to one another at approximately 50–55°.

Figure 1A:
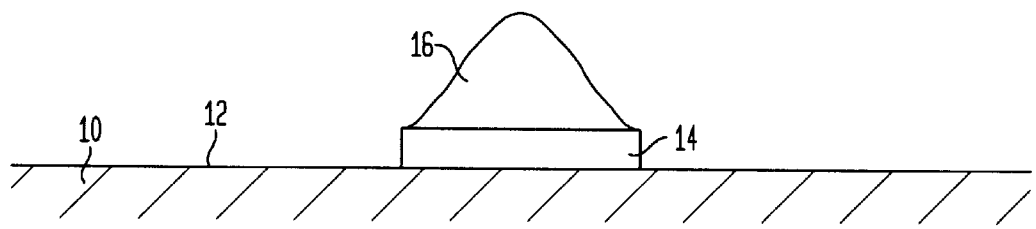
FIGS. 1A–1E show a prior art method of bonding leads to contacts.
Figure 1B:
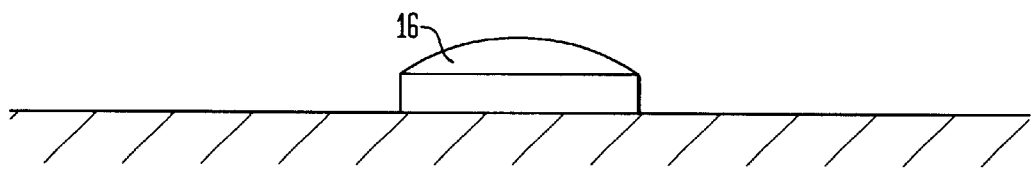
Figure 1C:
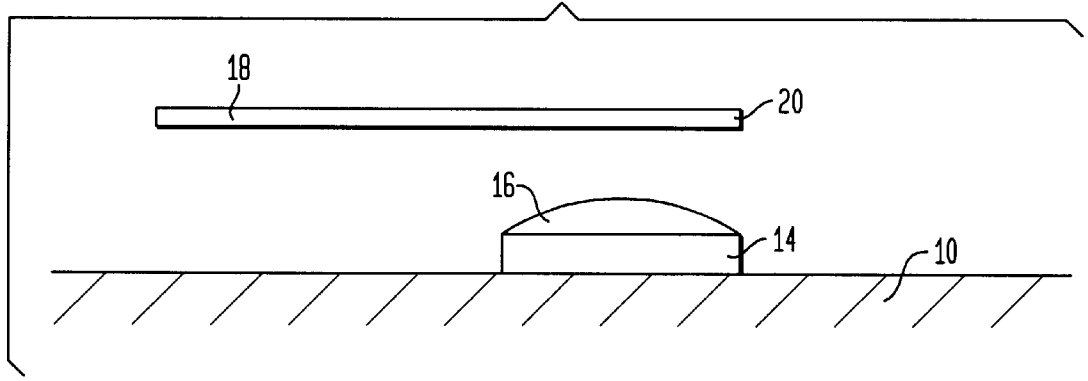
Figure 1D:
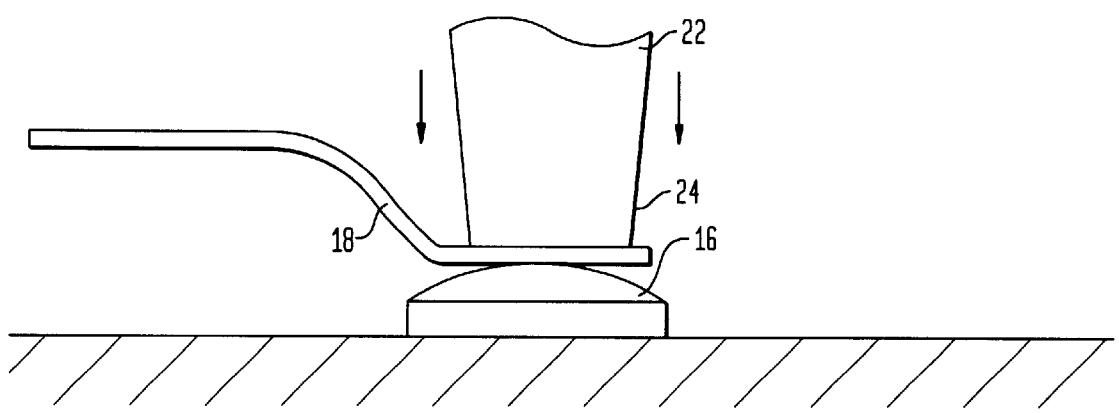
Figure 1E:
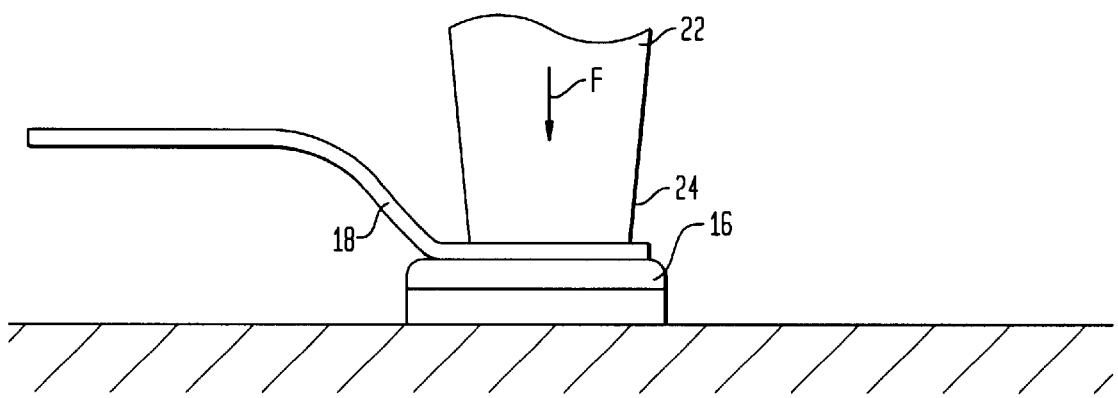
Figure 2A:
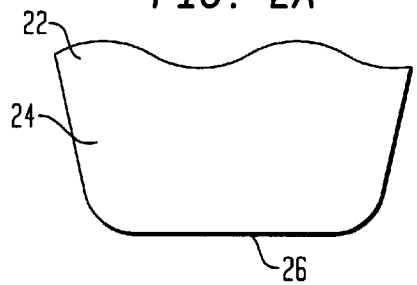
FIG. 2A shows a fragmentary side view of the tip end of a bonding tool.
Figure 2B:
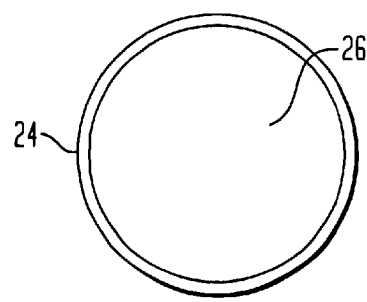
FIG. 2B shows a bottom view of the tip end of the bonding tool shown in FIG. 2A.
Figure 3:
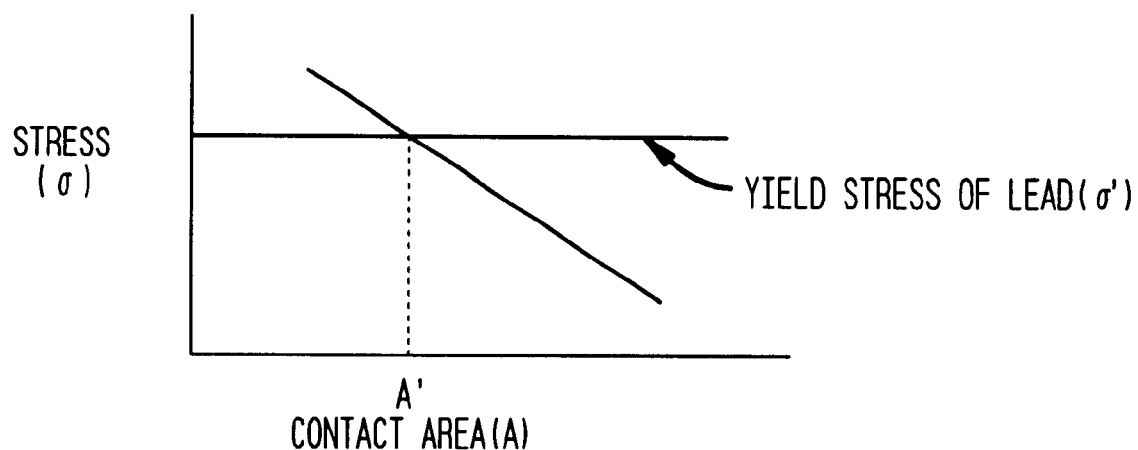
FIG. 3 shows a yield stress graph.
Figure 4:
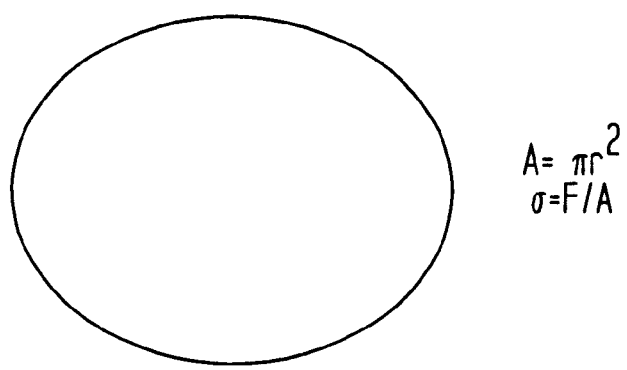
FIG. 4 shows a top view of a contact and formulas for calculating yield stress.

Although the present invention is not limited by any particular theory of operation, it is believed that the force applied to the lead by the bond tool should exceed the yield stress of the lead so as to produce plastic deformation and ensure a strong bond. As a result, the remaining bonding process factors of time and temperature can be reduced. Stress is defined by the equation σ=F/A where F=the bonding force and A=the contact area of the mating surfaces (the area of the lead that is bonded to the bump). Referring to the graphs shown in FIG. 3, it can be seen that the applied stress σ increases as the contact area decreases. For a given force F, if the stress yield of a particular lead is σ', then the contact area A should be less than or equal to A' in order for the lead to be plastically deformed.

Figure 6:
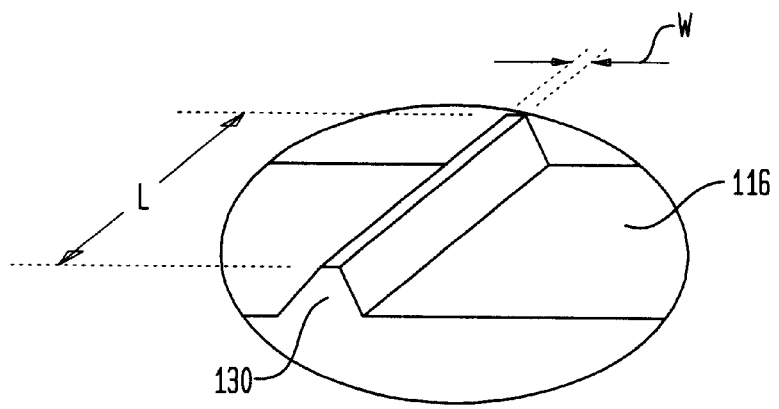
FIG. 6 shows a perspective view of a bondable contact having a wedge-shaped protrusion in accordance with preferred embodiments of the present invention.

The bump forming tool shown in FIG. 5A and FIG. 9 preferably forms the sharp wedge shaped protrusion 130 on the conductive bump 116 shown in FIG. 6.

Figure 7:
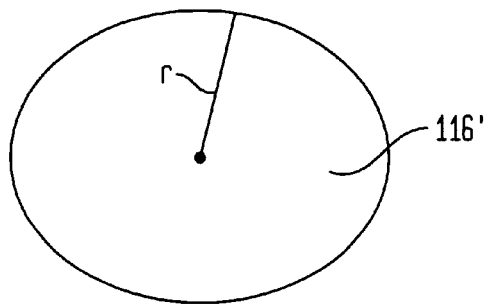
FIG. 7 shows a perspective view of a prior art contact.

The wedge shaped protrusion 130 has a length designated L and a width designated W. Thus, the mating surface area A1 of the wedge shaped protrusion =L×W and the force that must be applied to plastically deform the lead is determined by the equation $F_1=\sigma \times A1$, where σ is the yield strength of the lead material. In comparison, the substantially flat bump 130' shown in FIG. 7 has a mating surface area $A2=\pi \times r^2$ and the force that must be applied to plastically deform the lead is determined by the equation $F_2=\sigma \times A2$. Because A1<A2, the amount of force that must be exerted upon a lead bonded to wedge-shaped bump 116 (FIG. 6) is significantly less than the amount of force that must be applied to bond the same lead to the flat bump 116 (FIG. 7).

Example

The amount of stress required to bond to gold leads to gold contacts determined that the wedge shaped bumps shown in FIG. 6 is highly preferred for minimizing stress on the lead. a gold lead to a gold conductive bump was conducted. Three different types of gold bumps were provided. The first conductive gold bump included the wedge shaped protrusion shown in FIG. 6 having a length of approximately 3 mil and a width of approximately 0.5 mil for a total mating surface area of 1.5 mil². A second conductive bump was a coined stud bump having a diameter of 2 mil for a mating surface area $A2=\pi \times 1^2=3.4$ mil². The final conductive bump was a plated bump having a radius of 2 mil for a mating surface area $A3=3.14\times 2^2=12.56$ mil². Using the equation σ=F/A, it can be determined that the force required to bond a lead to the respective bumps is represented by the equation F=σ×A, where A=the mating surface area of the conductive bump bonded to the lead. As mentioned above, the force F≧σ×A to ensure sufficient plastic deformation of the lead for bonding. Taking the above equations and assuming that the yield stress value of gold is approximately 30000.00 psi it can be determined that the following forces must be exerted upon the leads:

Force for bonding a lead with contact having a wedge shaped protrusion:

F>(30,000 psi)(1.5 mil²)(1in²/10⁶mil²)=(0.045 lbs.) (0.45 Kg/lbs.)=20 g.

Force for bonding a lead with a contact having a coined stud bump:

F>(30,000 psi)(3.14 mil²)(1in²/10⁶mil²)=(0.094 lbs.) (0.45 Kg/lbs.)=42 g.

Force for bonding a lead with a contact having a plated bump area:

F>(30,000 psi)(12.56 mil²)(1in²/10⁶mil²)=(0.377 lbs.) (0.45 Kg/lbs.)=170 g.

Thus, it can be seen that utilizing a bump having a wedge shaped protrusion substantially reduces the amount of force which must be applied to the lead so as to obtain plastic deformation of the lead. Plastic deformation is essential for creating a sufficient bond between the lead and the bump. The present invention is directed to methods and tools used for forming conductive bumps having protrusions, thereby minimizing the force that must be applied to a lead to bond the lead to a conductive bump.

Figure 8A:
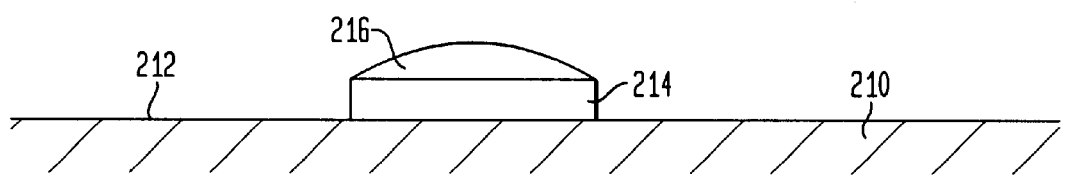
FIGS. 8A–8F shows a method for forming a bondable contact and bonding a lead to the bondable contact in accordance with preferred embodiments of the present invention.
Figure 8B:
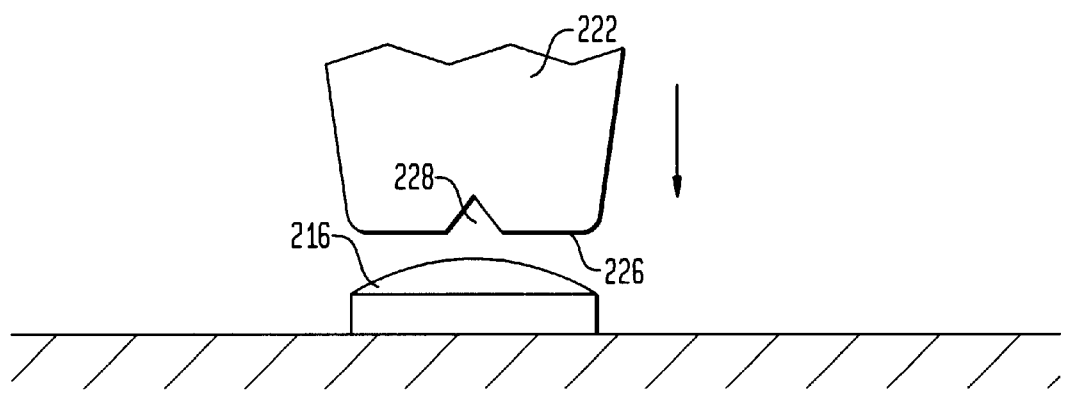

FIGS. 8A–8E shows one method for forming conductive bumps having wedge shaped protrusions in accordance with preferred embodiments of the present invention. Referring to FIG. 8A microelectronic element 210 such as a semiconductor chip, has a contact bearing face 212 with one or more die pads 214 and conductive bumps 216 formed atop the die pads 214. Referring to FIG. 8B, a bump forming tool in accordance with certain preferred embodiments of the present invention has a groove 228 formed at the tip end 226 thereof. The tool is positioned above the bump 216 so that the groove 228 is centered over the top of the bump 216.

Figure 8C:
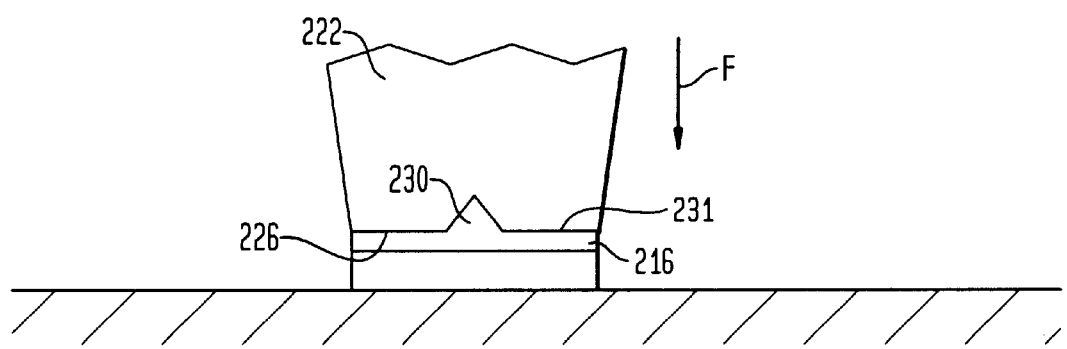
Figure 8D:
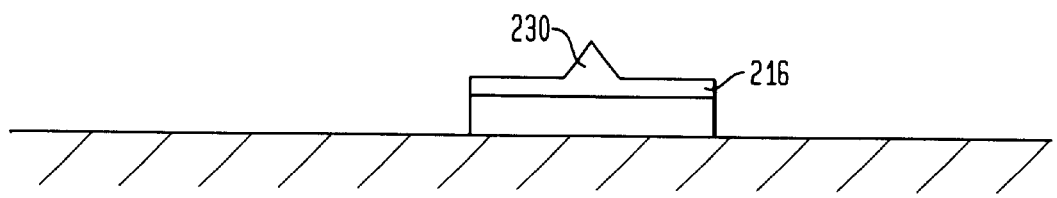
Figure 8E:
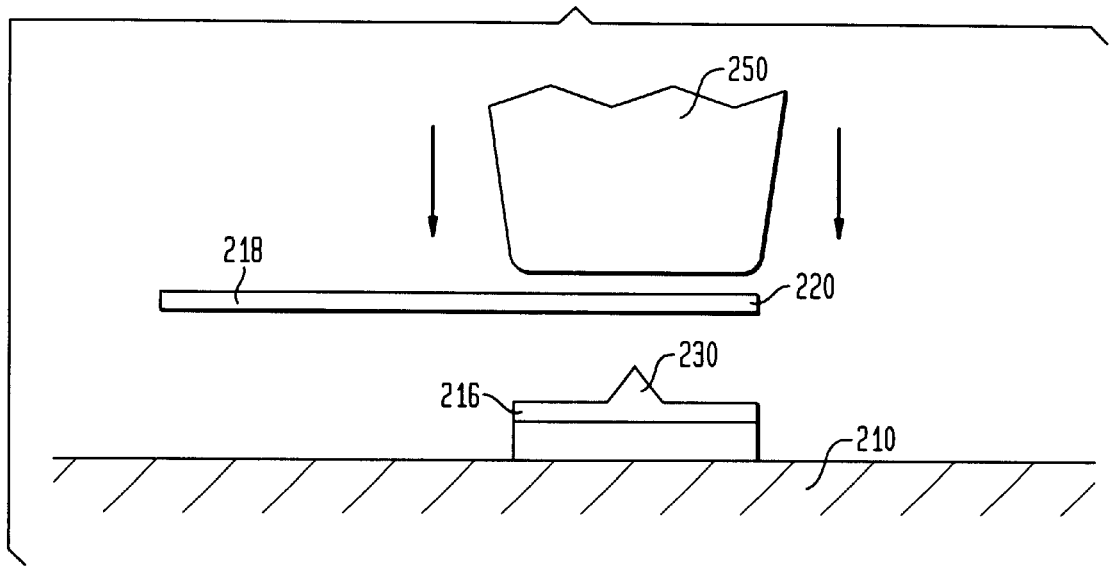

Referring to FIG. 8C, a downward force F is applied through the tip end 225 of the bump forming tool 222 to form a wedge shaped projection 230 in the bump 216 that extends above a substantially flat surface portion of the bump. FIG. 8D shows the bump 216 after formation of the wedge shaped projection 230. FIG. 8E shows microelectronic element 210 juxtaposed with a second microelectronic element (not shown) having one or more leads 218. The tip ends 220 of the lead 218 is aligned over the bump 216 and the wedge shaped projection 230 thereof. The bond tool 250 is then moved in a downward direction for deforming the lead and bonding tip end 220 of lead 218 to conductive bump 216. As mentioned above, a sufficient force must be applied to obtain plastic deformation of flexible lead 218 so as to create a diffusion bond between the flexible lead 218 and the bump 216.

Figure 8F:
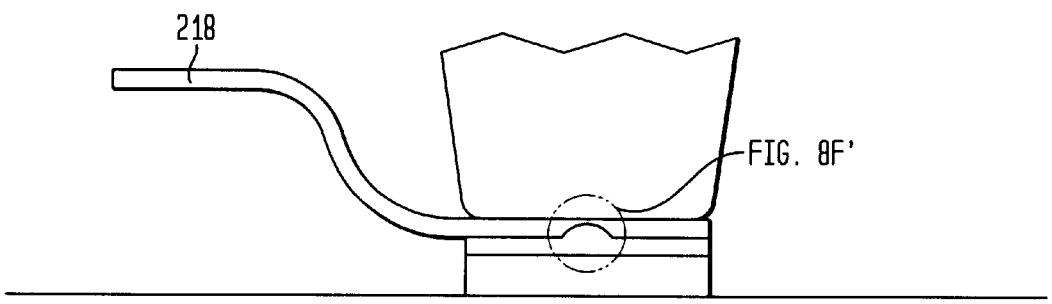
Figure 8F:
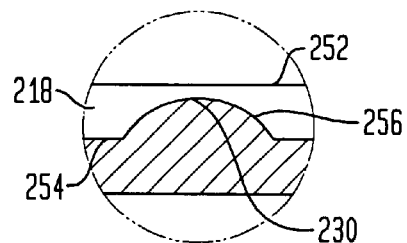

FIG. 8F' shows a fragmentary close up view of the portion of lead 218 that is plastically deformed during bonding. The lead has a top surface 252 and a bottom surface 254. The lead 218 includes a deformed section 256 that is deformed by the protrusion 230 and the force applied by the bonding tool 250 (FIG. 8E). As set forth above, due to the smaller area of the wedge shaped protrusion 230, as opposed to a substantially flat conductive bump shown in the prior art, the force necessary for plastic deformation of lead 218 is substantially reduced. As a result, the overall stress exerted upon lead 218 is diminished, thereby improving the structural integrity of the bond. Application of greater amounts of bonding force, such as that required for conductive bumps having substantially flat bonding surfaces, may damage the leads during a bonding operation, thereby minimizing the reliability of the electrically interconnection created by the bond and weakening the leads.

Figure 10A:
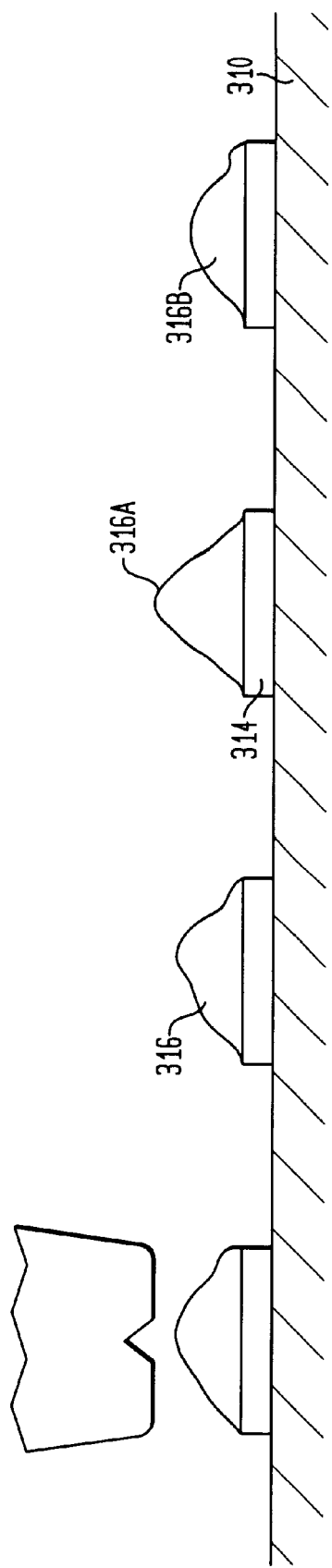
FIGS. 10A–10B show a method of forming bondable contacts in accordance with further embodiments of the present invention.
Figure 10B:
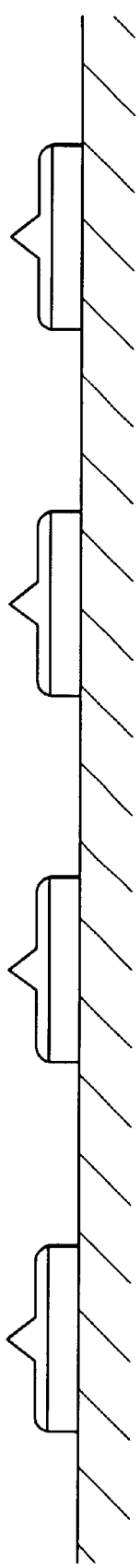
Figure 11:
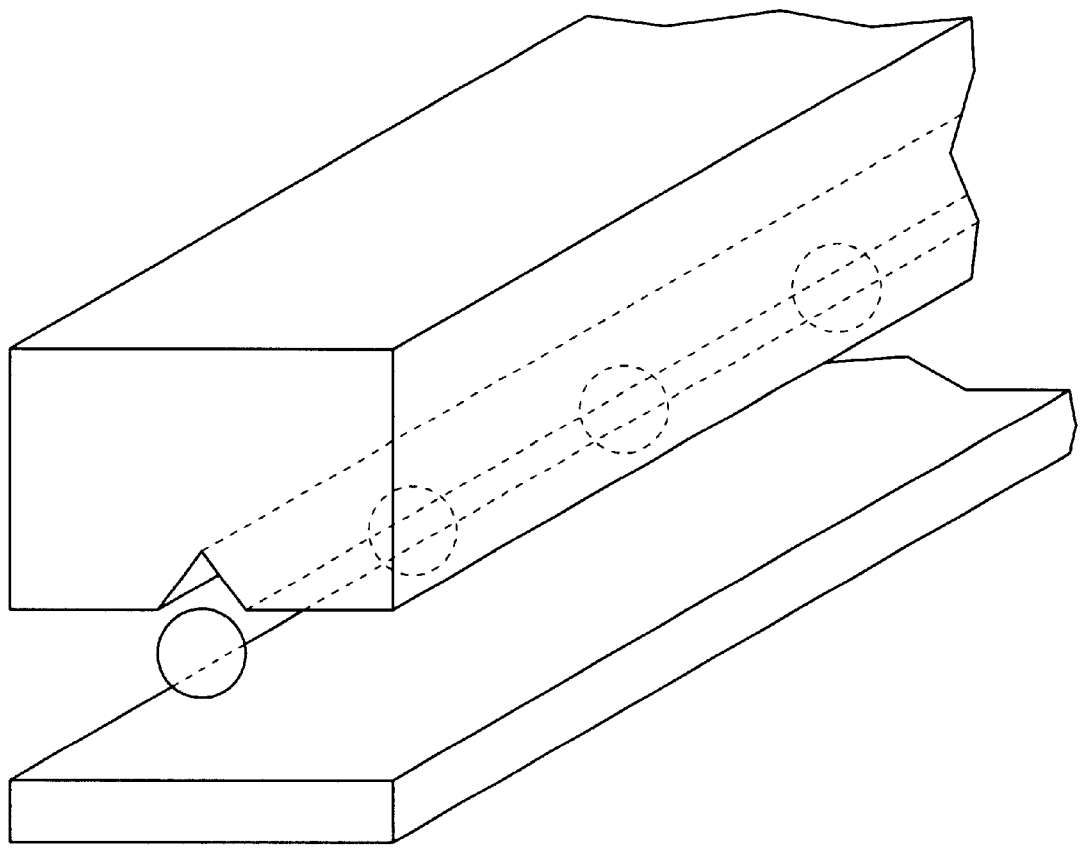
FIG. 11 shows a "gang-bumping" contact forming tool in accordance with further preferred embodiments of the present invention.
Figure 12:
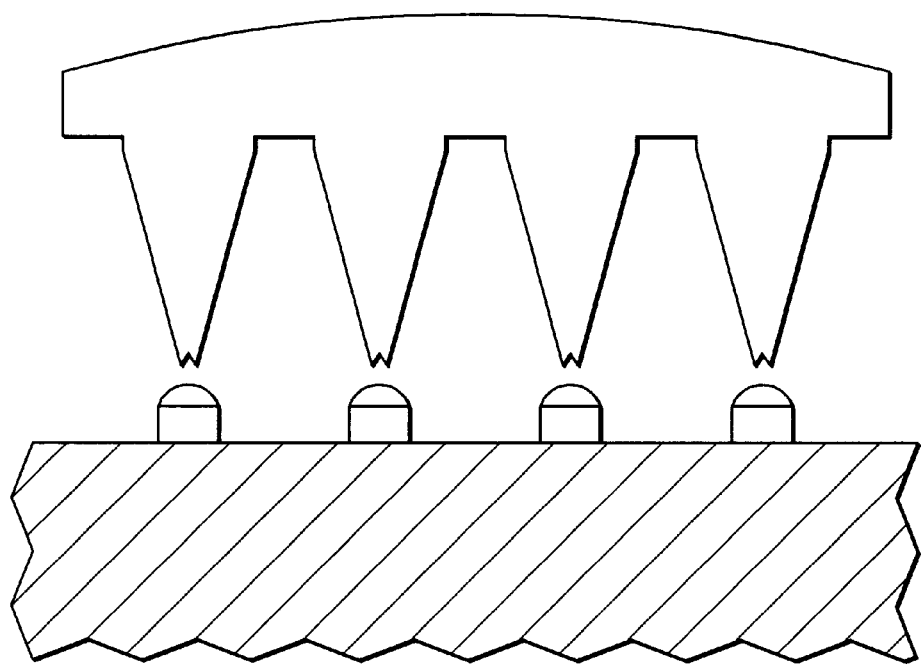
FIG. 12 shows a "gang-bumping" contact forming tool in accordance with still further preferred embodiments of the present invention.

FIG. 10A shows another preferred method for forming conductive bumps having wedge shaped protrusions. FIG. 10A shows microelectronic element 310 having die pads 314 with conductive bonding material 316 deposited atop the die pads 314. The conductive bonding material 316 has been deposited using a wire bonding tool whereby the bumps have a shape which is typically described as a "Hershey Kiss" shaped bump. One drawback associated with forming bumps using a wire bonding tool is that the respective heights of the bumps may vary dramatically. For example, bump 316A has an apex that is substantially higher than the apex of bump 316B. The non-uniformity of the bumps 316 may create problems during a bonding operation because sufficient force may not be provided for bonding all of the leads to all of the bumps. On the other hand, too much force may be applied for bonding the leads to one of the bumps. In order to create uniform leads having a substantially uniform shape the bump forming tool of the present invention (FIGS. 5A and 5B) may be used to form a series of bumps having wedge shaped protrusions, whereby each bump is substantially similar in shape and height. FIG. 10B shows the conductive bumps after wedge shaped protrusions have been formed atop each bump. The wedge shaped protrusions are substantially similar in shape and the apex of each protrusion is about the same height. As a result, the amount of force necessary to bond leads to the bumps may be more precisely controlled so that only as much force as is absolutely necessary maybe used to plastically deform the leads and create effective bonds. In certain preferred embodiments, a plurality of conductive bumps having wedge-shaped protrusions may be formed simultaneously using a "gang-bumping" process. FIG. 11 shows one preferred contact forming tool that may be used to simultaneously form a plurality of contacts having wedge-shaped protrusions. FIG. 12 shows another embodiment for "gang-bumping" a plurality of contacts wherein a plurality of bump forming tools, such as that shown in FIGS. 5A and 5B are joined to simultaneously engage a plurality of contacts.

Figure 13A:
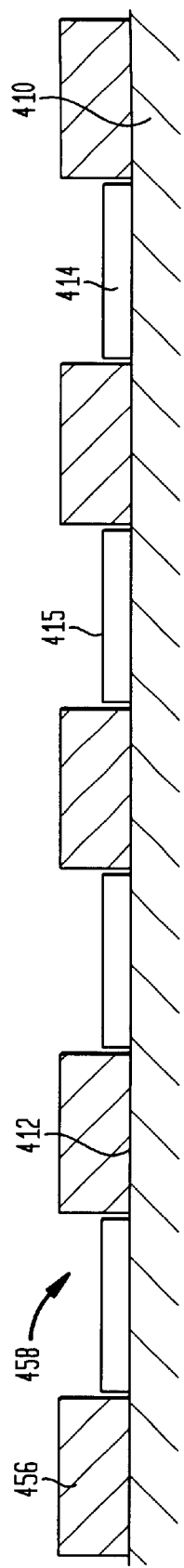
FIGS. 13A–13E show a method of forming bondable contacts in accordance with still further embodiments of the present invention.
Figure 13B:
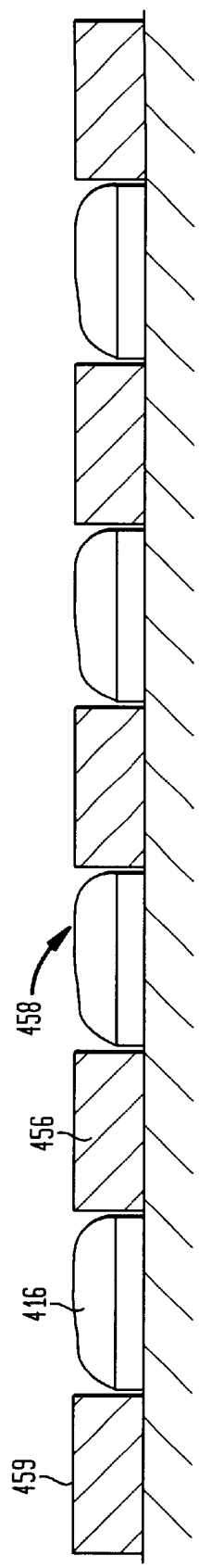
Figure 13C:

FIGS. 13A–13D show a method of forming conductive bumps having wedge shaped protrusions in accordance with further preferred embodiments of the present invention. Referring to 13A, microelectronic element 410 includes die pads 414 having top surface 415. A stencil 456 having a plurality of openings 458 is provided atop contact bearing surface 412 of microelectronic element 410. The plurality of openings 458 are preferably in registration with die pads 414 when the stencil 456 is placed atop the contact bearing face 412 of microelectronic element 410. A conductive material 416, such as a conductive gold paste, is swept across the top surface 459 of stencil 456 such as by using a squeegee (not shown). During the stenciling operation, a pad of conductive material 416 is deposited in each stencil opening 458. Referring to FIG. 13C the stencil is then removed and the pads of conductive material are reflowed to form bumps having substantially annular top surfaces.

Figure 13D:
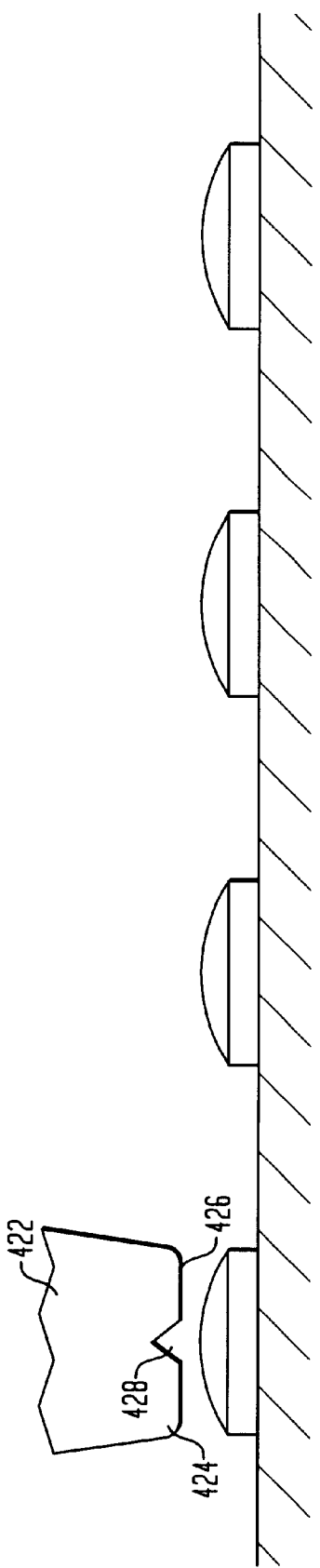
Figure 13E:
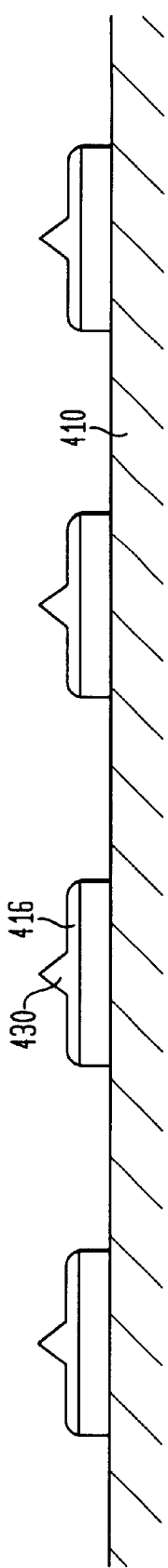

Referring to FIG. 13D a bump forming tool in accordance with preferred embodiments of the present invention is then utilized to form conductive bumps having wedge shaped protrusions. FIG. 13D shows bump forming tool 422 having tip end 424. The tip end 424 has substantially flat surface 426 with V-shaped groove 428. FIG. 13E shows the microelectronic element 410 having conductive bumps 416 with wedge-shaped protrusions 430. The conductive bumps are substantially uniform in height. As a result, an extremely uniform and precise amount of force may be applied to each lead when bonding leads to the conductive bumps 416.

In an alternate embodiment, bondable contact bumps 416 with wedge shaped protrusions 430 may be disposed on the ends of leads provided on a connection component. Such a lead can then be bonded to a microelectronic element such as a chip or a wafer.

These and other variations and combinations of the features described above may be utilized without departing from the present invention as defined by the claims. Thus, the foregoing description of preferred embodiments should be taken by way of illustration rather than by way of limitation of the claimed invention.

What is claimed is:

1. A method of making bondable contacts on a microelectronic element comprising:
    (a) providing a microelectronic element having one or more pads on a first face thereof, said pads including a conductive bonding material;
    (b) shaping said conductive bonding material on said pads to form bondable contacts, wherein each said bondable contact has a substantially flat region and a second region projecting above the substantially flat region and wherein said second region projecting above the substantially flat region includes an apex adapted to abut against an opposing electrically conductive element.

2. The method as claimed in claim 1, wherein a plurality of said bondable contacts are formed simultaneously.

3. The method as claimed in claim 1, wherein the projecting region of said contact is bounded by the substantially flat region thereof.

4. The method as claimed in claim 3, wherein the projecting region of said contact defines a wedge-shaped projection.

5. The method as claimed in claim 4, wherein each said wedge-shaped projection includes said apex above the substantially flat region of said contact.

6. The method as claimed in claim 5, wherein each said wedge-shaped projection includes side walls extending between the apex and the substantially flat region of said contact.

7. The method as claimed in claim 6, wherein said side walls form an acute angle relative to one another.

8. The method as claimed in claim 1, wherein the providing step includes depositing conductive bonding material on said pads.

9. The method as claimed in claim 1, wherein the shaping the conductive bondable material step includes:
    providing a contact forming tool having a tip end, said tip end including a substantially flat surface having a depression formed therein; and
    abutting the tip end of the contact forming tool against the conductive bonding material.

10. The method as claimed in claim 9, wherein the depression includes a groove extending across the tip end of said tool.

11. The method as claimed in claim 10, wherein said groove has a V-shape when viewed in cross-section.

12. The method as claimed in claim 11, wherein the V-shaped groove has sidewalls that form an acute angle relative to one another.

13. The method as claimed in claim 12, wherein the sidewalls of said V-shaped groove meet at a bottom portion of said groove, said bottom portion being substantially flat.

14. A method of making a microelectronic assembly comprising:
    (a) providing a first microelectronic element having a front face and a plurality of bondable contacts on said front face, wherein each said bondable contact has a substantially flat region and a second region projecting above the substantially flat region and wherein said second region projecting above the substantially flat region includes an apex adapted to abut against an opposing electrically conductive element;

(b) providing a second microelectronic element having one or more leads with bond regions;

(c) juxtaposing the second microelectronic element with the first microelectronic element so that the bond regions of the leads overlie the bondable contacts;

(d) abutting the bond regions of the leads against the projecting regions of the contacts; and (e) bonding the bond regions of the leads to the contacts, wherein the projecting regions of the contacts engage and bond to the bond regions of the leads.

15. The method as claimed in claim 14, wherein said first microelectronic element is a semiconductor chip.

16. The method as claimed in claim 14, wherein said first microelectronic element is a semiconductor wafer.

17. The method as claimed in claim 14, wherein the second microelectronic element is a connection component.

18. The method as claimed in claim 14, wherein said projecting regions have longitudinal axes and wherein the juxtaposing step includes aligning the leads with the projecting regions so that the leads extend in directions substantially transverse to the longitudinal axes of the projecting regions.

19. The method as claimed in claim 14, wherein the projecting region of said contact is bounded by the substantially flat region thereof.

20. The method as claimed in claim 19, wherein the projecting region of said contact defines a wedge-shaped projection.

21. The method as claimed in claim 20, wherein each said wedge-shaped projection includes an apex above the substantially flat region of said contact.

22. The method as claimed in claim 21, wherein each said wedge-shaped projection includes side walls extending between the apex and the substantially flat region of said contact.

23. The method as claimed in claim 22, wherein said side walls form an acute angle relative to one another.

24. The method as claimed in claim 14, wherein the providing a first microelectronic element step includes:

providing a contact forming tool having a tip end, said tip end including a substantially flat surface having a depression formed therein; and abutting the tip end of the contact forming tool against conductive bonding material to form the bondable contacts.

25. The method as claimed in claim 24, wherein the depression in the tip end of said tool includes a groove extending across the tip end.

26. The method as claimed in claim 25, wherein said groove has a V-shape when viewed in cross-section.

27. The method as claimed in claim 26, wherein the V-shaped groove has sidewalls that form an acute angle relative to one another.

* * * * *